US007170163B2

(12) United States Patent
Murakami

(10) Patent No.: US 7,170,163 B2
(45) Date of Patent: Jan. 30, 2007

(54) SEMICONDUCTOR DEVICE MOUNTING STRUCTURE HAVING ZIGZAGGING PART

(75) Inventor: Yoshinori Murakami, Shinjuku-ku (JP)

(73) Assignee: Nissan Motor Co., Ltd., Yokohama (JP)

( * ) Notice: Subject to any disclaimer, the term of this patent is extended or adjusted under 35 U.S.C. 154(b) by 192 days.

(21) Appl. No.: 10/998,990

(22) Filed: Nov. 30, 2004

(65) Prior Publication Data

US 2005/0121783 A1 Jun. 9, 2005

(30) Foreign Application Priority Data

Dec. 3, 2003 (JP) .............................. 2003-404188

(51) Int. Cl.
*H01L 23/10* (2006.01)
*H01L 23/34* (2006.01)

(52) U.S. Cl. ...................... 257/707; 257/713; 257/719; 257/E27.008

(58) Field of Classification Search ................ 257/706, 257/707, 712, 713, 717, 718, 719, 720, E27.008
See application file for complete search history.

(56) References Cited

U.S. PATENT DOCUMENTS 6,512,291 B2 * 1/2003 Dautartas et al. ........... 257/706
6,611,425 B2 * 8/2003 Ohashi et al. .............. 361/687
2002/0117330 A1 * 8/2002 Eldrige et al. .............. 174/260

FOREIGN PATENT DOCUMENTS

JP 2000-102260 4/2000

* cited by examiner

*Primary Examiner*—Ngân V. Ngô
(74) *Attorney, Agent, or Firm*—Global IP Counselors, LLP

(57) ABSTRACT

A semiconductor device mounting structure includes a bus bar of which a first end part is connected to a high-temperature power-purpose semiconductor device and a second end is connected to another device that is required to be kept at a lower temperature than the semiconductor device. The bus bar includes a ribbonlike part zigzagging between the first and second ends. The ribbonlike part of the bus bar can improve the cooling effect by increasing the length of the path through which the heat travels in the lengthwise direction of the bus bar. Thus, the heat emitted from the semiconductor device is prevented from being transferred to a peripheral circuit element through the bus bar used for supplying electric power to the circuit element from the semiconductor device.

15 Claims, 16 Drawing Sheets

SEMICONDUCTOR DEVICE MOUNTING STRUCTURE HAVING ZIGZAGGING PART

BACKGROUND OF THE INVENTION

1. Field of the Invention

The present invention relates to a semiconductor device mounting structure. Specifically, the present invention relates to a mounting structure for a semiconductor device used for electric power applications which requires cooling.

2. Background Information

Japanese Laid-Open Patent Publication No. 2000-102260 discloses one example of a conventional semiconductor device mounting structure utilizing a bus bar unit. As used herein throughout the disclosure of the present invention, a bus bar refers to a wiring structure for exchanging current between a semiconductor device and an external or peripheral device such as an electrical circuit element. In such conventional semiconductor mounting structure as disclosed in the above reference, the bus bar unit is mounted on a power-purpose semiconductor device and serves as a medium for transmitting a main current between the semiconductor device and an external electrical device. More specifically, the semiconductor device is connected to the electrical circuit element (for example, an electrolytic capacitor) by a pair of first bus bars and a second bus bar. The first bus bars are arranged so as to sandwich the second bus bar. An insulating material is disposed between the first bus bars and the second bus bars to insulate the first and second bus bar from each other. Several separate bus bars are also connected to the semiconductor device. Moreover, several separate bus bars are connected between the electrical circuit element and farther external electrical devices other than the semiconductor device.

If, for example, the semiconductor device in the conventional semiconductor device mounting structure as mentioned above operates at a high temperature, heat will be transmitted from the semiconductor device to the electrical circuit element through the first and second bus bars disposed between the semiconductor device and the electrical circuit element. Since the electrical resistance is proportional to the thermal resistance in all metals, heat is transmitted readily through metals that have low electrical resistance values. Thus, since the bus bars are required to have a low electrical resistance, heat is transmitted readily through the bus bars. Although the temperatures of the semiconductors generally do not exceed 150° C., wide-gap semiconductors have recently been used for power applications. Therefore, the problem of heat being transmitted through the bus bars from the semiconductor device to peripheral electrical circuit elements that are not very resistant to high temperatures is becoming increasingly significant.

In view of the above, it will be apparent to those skilled in the art from this disclosure that there exists a need for an improved semiconductor device mounting structure. This invention addresses this need in the art as well as other needs, which will become apparent to those skilled in the art from this disclosure.

SUMMARY OF THE INVENTION

The bus bar used in the conventional semiconductor mounting structure as mentioned above are configured and arranged to allow current to flow with a low degree of loss, and thus, also allow heat to be transferred easily through the bus bars. Consequently, if the semiconductor device connected to one end of the bus bar reaches a high temperature, the heat will reach the other end of the bus bar. If the electric device connected to the other end of the bus bar is an electrolytic capacitor or other device that usually cannot withstand high temperatures, the bus bar itself is required to be cooled down so that the heat will not be transmitted to the electric device. However, since the performance levels of cooling devices for cooling the bus bar are limited, the length of the bus bar is required to be increased in order to obtain adequate cooling. As a result, the wiring inductance increases and the size of the overall semiconductor device mounting structure becomes large.

The present invention was conceived in view of these problems and one object of the present invention is to provide a relatively compact semiconductor device mounting structure with low inductance that is capable of avoiding the problem of high temperatures being transferred to an external device through a bus bar.

In order to achieve the aforementioned and other objects of the present invention, a semiconductor device mounting structure is provided that comprises a first end part, a second end part and a ribbonlike part. The first end part is configured and arranged to be connected to a first main terminal of a heat-emitting semiconductor device. The second end part is configured and arranged to be connected to a first main terminal of an electrical device that requires to be kept at a lower temperature than the semiconductor device. The ribbonlike part zigzags between the first and second end parts.

These and other objects, features, aspects and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Figure 1:
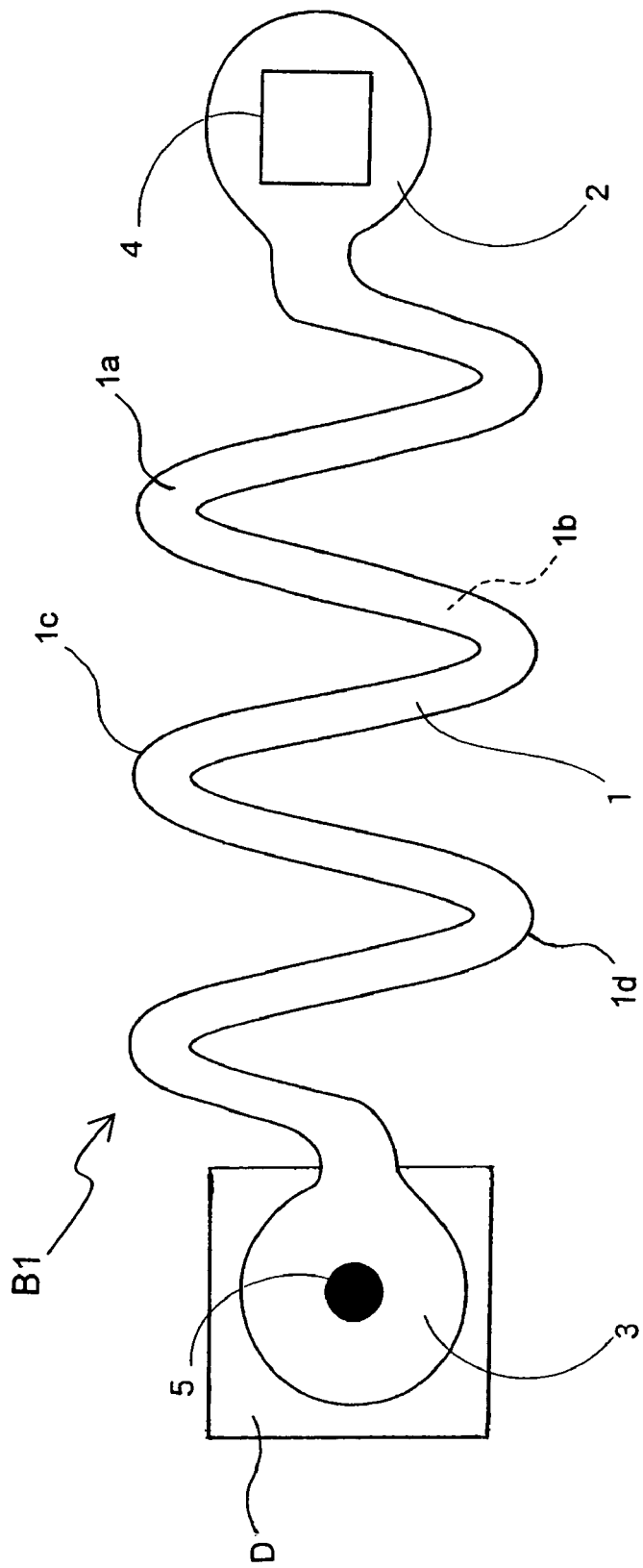
FIG. 1 is a top plan view of a semiconductor device mounting structure connecting a semiconductor device with an electrical device in accordance with a first embodiment of the present invention.

Referring initially to FIG. 1, a semiconductor device mounting structure is illustrated in accordance with a first embodiment of the present invention. FIG. 1 is a top plan view of a bus bar B1 of the semiconductor device mounting structure in accordance with a first embodiment of the present invention. The bus bar B1 is preferably made of aluminum copper, or other metal possessing a high electrical conductivity. As seen in FIG. 1, the bus bar B1 includes a ribbonlike part or zigzag part 1, a first end part or first terminal 2, and a second end part or second terminal 3. The zigzag part 1 of the bus bar B1 preferably extends between the first end part 2 and the second end part 3. In the first embodiment of the invention, the zigzag part 1 of the bus bar B1 is preferably arranged as a sheet-shape member having a first main surface 1*a* and a second main surface 1*b* that is disposed on an opposite side of the first main surface 1*a*. The first terminal 2 and the second terminal 3 are also preferably arranged as sheet-shape members that are integrally formed with the zigzag part 1 so that the current flows between the first terminal 2 and the second terminal 3. In the first embodiment of the present invention, the zigzag part 1 of the bus bar B1 preferably zigzags within a plane that is parallel to the first and second main surfaces 1*a* and 1*b*. More specifically, as seen in FIG. 1, the zigzag part 1 of the bus bar B1 includes first and second edges 1*c* and 1*d* with a contour or shape that follows a line or course that proceeds by sharp turns in alternating directions. In other words, the zigzag part 1 of the bus bar B1 includes a series of sharp turns or angles that alternate directions of the courses of the first and second edges 1*c* and 1*d*.

The first terminal 2 is preferably electrically coupled to a first electrode provided on a first main surface of a semiconductor device 4. In the present invention, the semiconductor device 4 can be a semiconductor chip, a chip size package, or a module package. In any event, the semiconductor device 4 is a conventional component that is well known in the art. Since the semiconductor device 4 is well known in the art, the precise structure of the semiconductor device 4 will not be discussed or illustrated in detail herein.

The second terminal 3 of the bus bar B1 is preferably electrically coupled to an external (electrical) device D such as a motor, a smoothing capacitor, or other device. More specifically, in the present invention, the external device D is preferably an electric device that usually cannot withstand high temperatures (i.e., the device that requires to be kept at a lower temperature than the semiconductor device 4). As seen in FIG. 1, the second terminal 3 is provided with a threaded hole 5 for coupling the bus bar B1 to the external device D. The threaded hole 5 is indicated as a solid black circle herein in the attached drawings.

In the semiconductor device mounting structure of the first embodiment, the zigzag part 1 of the bus bar B1 that extends between the first terminal 2 and the second terminal 3 is configured and arranged to effectively extend the distance through which heat is transmitted from the first terminal 2 coupled to the semiconductor device 4 to the second terminal 3 coupled to the external device D when the temperature of the semiconductor device 4 becomes high. In other words, the zigzag part 1 of the bus bar B1 is configured and arranged to increase the surface area of the bus bar B1 from which heat is released while being transmitted from the first terminal 2 to the second terminal 3. Thus, the bus bar B1 of the first embodiment is configured and arranged to suppress the increase in temperature in the external device D caused by the heat being transmitted from the semiconductor device 4 to the external device D.

Accordingly, when the temperature of the semiconductor device 4 becomes high, it is necessary to prevent heat from traveling from the first terminal 2 of the bus bar B1 that is coupled to the semiconductor device 4 to the second terminal 3 of the bus bar B1 that is coupled to the external device D. In the semiconductor device mounting structure of the first embodiment, the bus bar B1 is configured and arranged to improve the cooling effect by increasing the length of the path through which the heat travels in the lengthwise direction of the bus bar B1. More specifically, a certain distance is usually required in order to radiate the heat from the bus bar B1. The zigzag part 1 of the bus bar B1 in accordance with the present invention is configured and arranged to increase the length over which the heat is radiated from the bus bar B1 while keeping the overall size of the bus bar B1 compact. Thus, the bus bar B1 can fit into a more compact space.

Although providing the zigzag part 1 in the bus bar B1 may result in a higher electrical resistance, the influence of the higher electrical resistance on the semiconductor device mounting structure or system as a whole is small. Moreover, with the bus bar B1 of the first embodiment, the wiring inductance can be held lower than a case in which a bus bar extends in a straight line.

Figure 2:
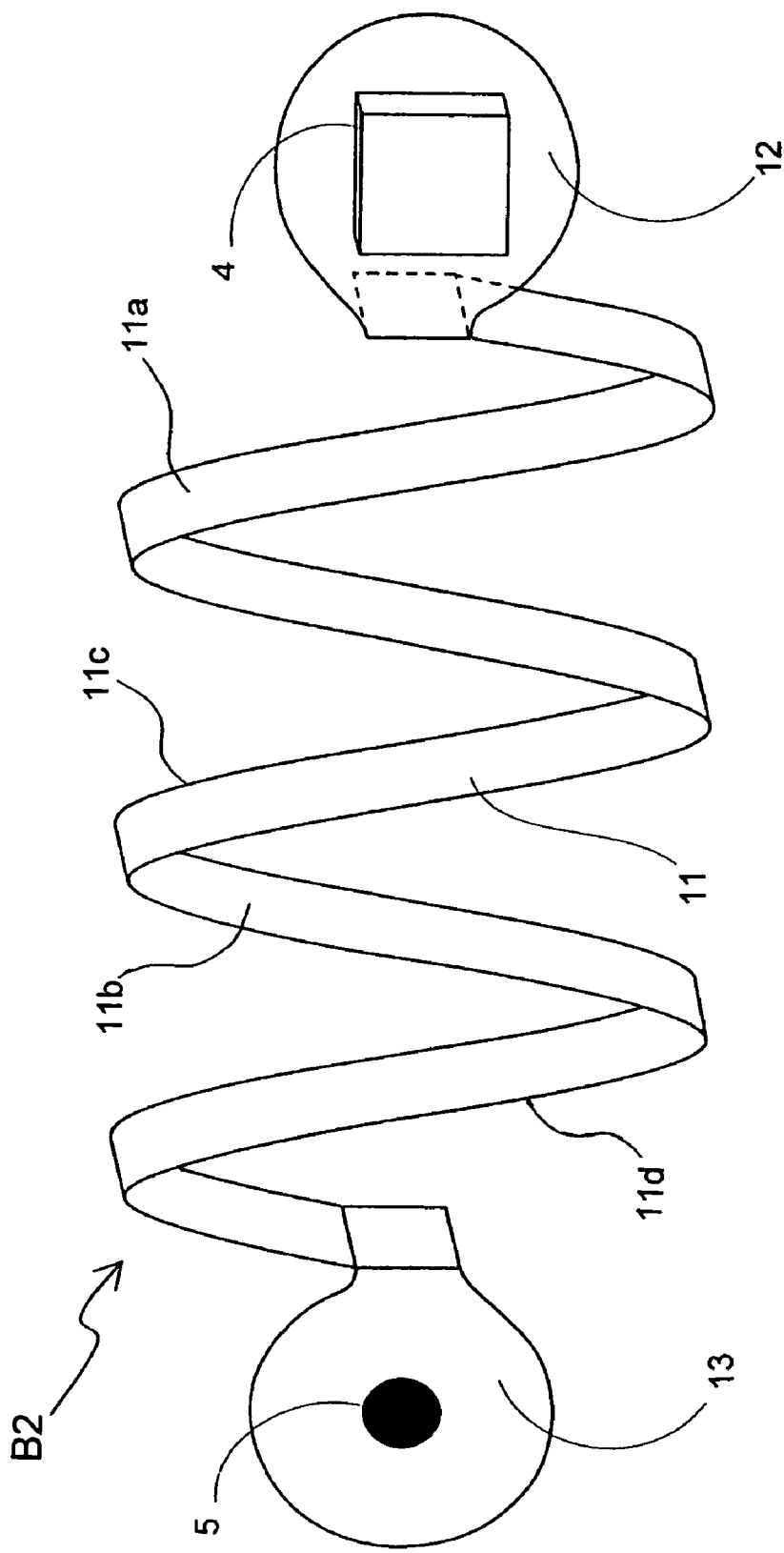
FIG. 2 is a simplified perspective view of a semiconductor device mounting structure in accordance with a second embodiment of the present invention.
Figure 3:
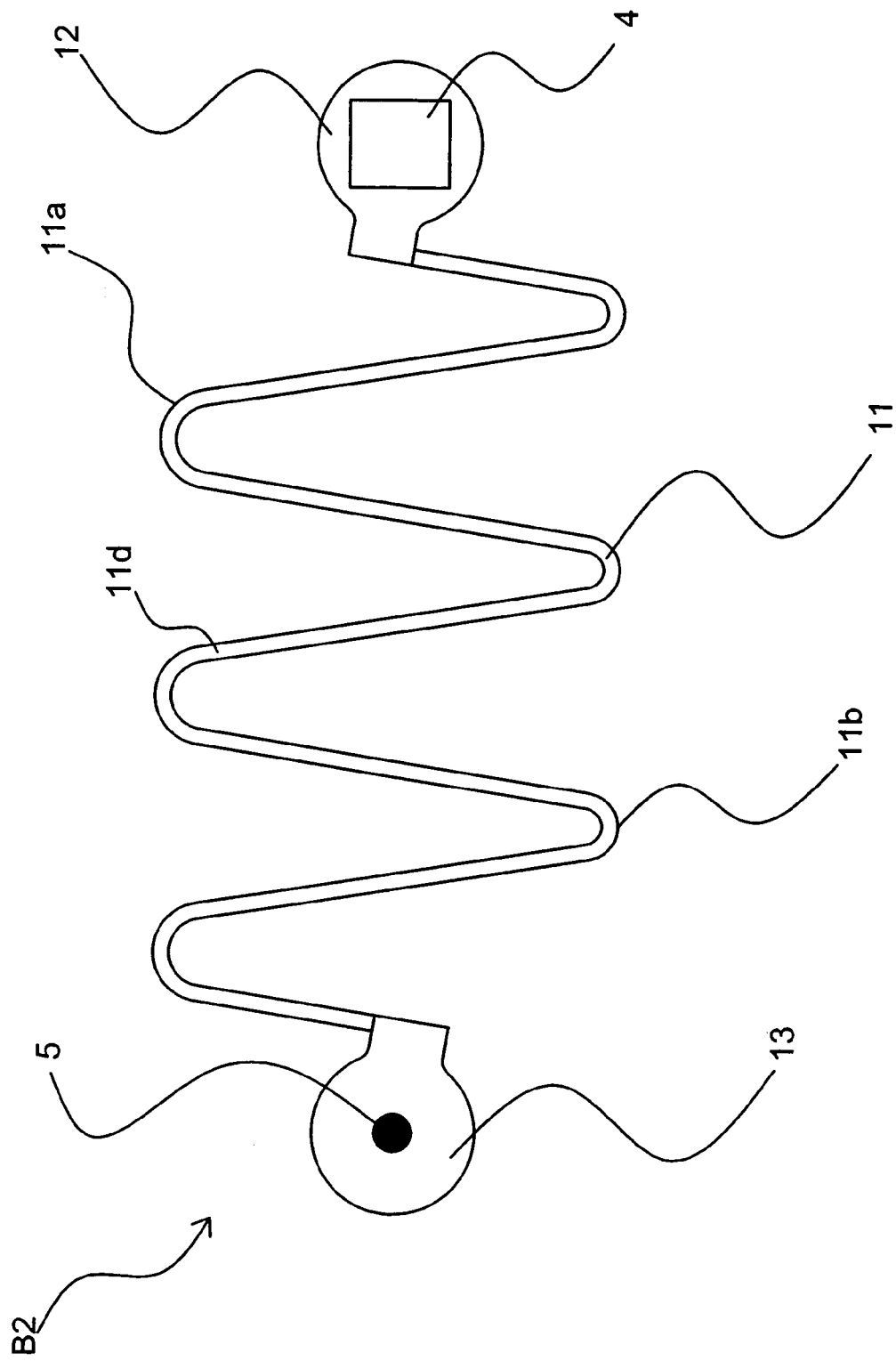
FIG. 3 is a top plan view of the semiconductor device mounting structure illustrated in FIG. 2 in accordance with the second embodiment of the present invention.

FIGS. 2 and 3 illustrate a bus bar B2 used in a semiconductor device mounting structure in accordance with a second embodiment of the present invention. The semiconductor device mounting structure of the second embodiment is basically identical to the semiconductor device mounting structure of the first embodiment except the bus bar B2 is substituted for the bus bar B1 of the first embodiment. Thus, although not shown in FIGS. 2 and 3, a second terminal 13 of the bus bar B2 is configured and arranged to be coupled to the external device D through the threaded hole 5 as shown in FIG. 1. FIG. 2 is a simplified perspective view of the bus bar B2 used in the semiconductor device mounting structure of the second embodiment. For the illustration purposes, the thickness dimension of the bus bar B2 is not depicted in FIG. 2. FIG. 3 is a top plan view of the bus bar B2 illustrated in FIG. 2. In view of the similarity between the first embodiment and the following embodiments, the parts of the following embodiments that are identical to the parts of the first embodiment will be given the same reference numerals as the parts of the first embodiment. Moreover, the descriptions of the parts of the following embodiments that are identical to the parts of the first embodiment may be omitted for the sake of brevity.

In the second embodiment, a zigzag part 11 of the bus bar B2 is preferably configured and arranged to have a shape that is substantially similar to a ribbon or strip-shaped member that has been folded back and forth while first and second edges 1c and 11d of the zigzag part 11 are aligned as seen in FIGS. 2 and 3. In other words, the zigzag part 11 of the bus bar B2 preferably zigzags within a plane that is parallel to the first and second edges 11c and 11d of the bus bar B2. Thus, as seen in FIGS. 2 and 3, the zigzag part 11 of the bus bar B2 includes first and second main surfaces 11a and 11b with a contour or shape that follows a line or course that proceeds by sharp turns in alternating directions. This arrangement of the zigzag part 11 of the bus bar B2 has the advantage of being less susceptible to stresses resulting from thermal expansion.

Figure 4:
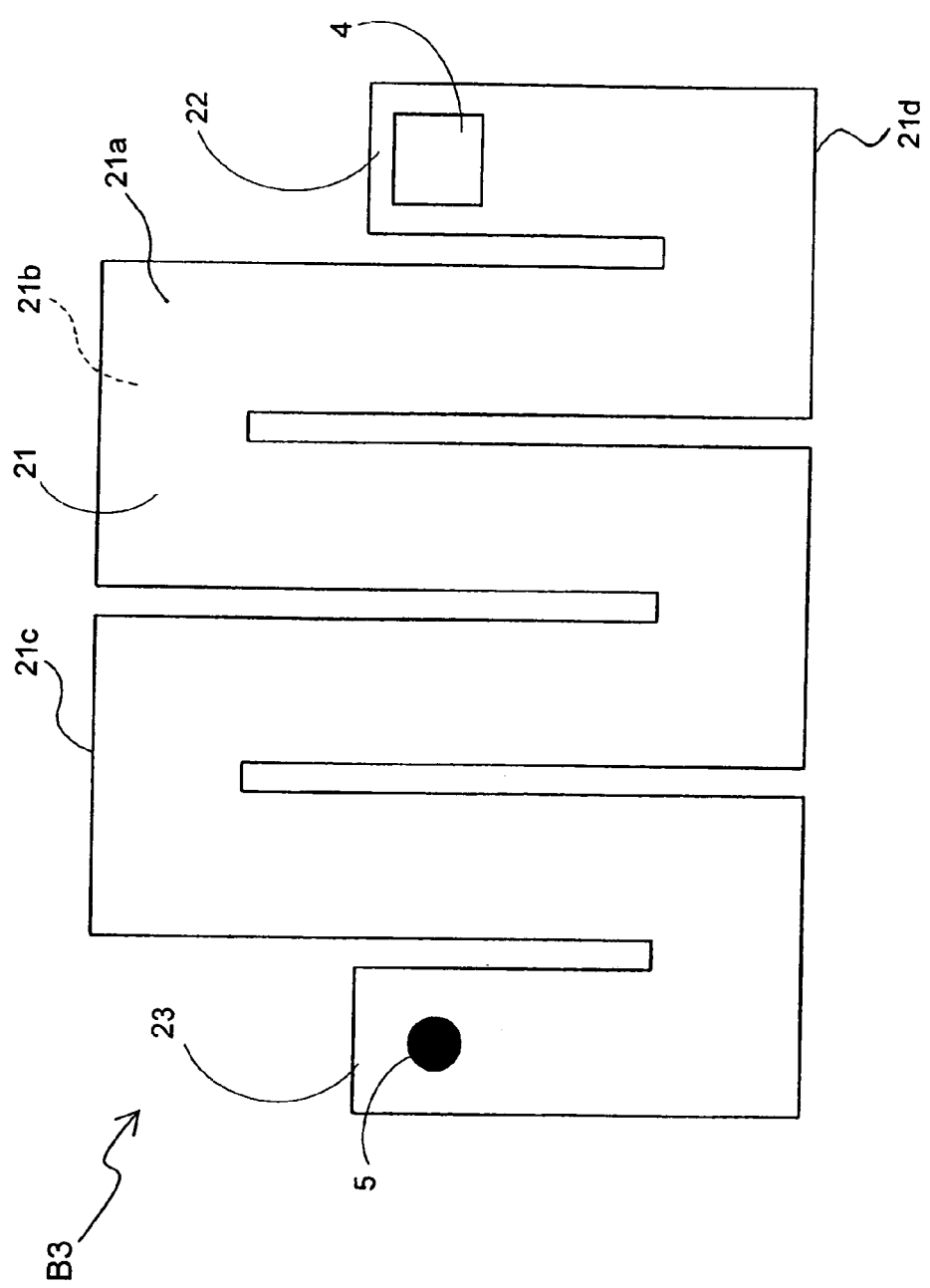
FIG. 4 is a top plan view of a semiconductor device mounting structure in which the semiconductor device mounting structure illustrated in FIG. 1 is modified in accordance with a third embodiment of the present invention.

FIG. 4 is a top plan view of a bus bar B3 used in a semiconductor device mounting structure of a third embodiment. In the third embodiment of the present invention, the bus bar B1 of the semiconductor device mounting structure of the first embodiment shown in FIG. 1 is slightly modified to obtain the bus bar B3 of the third embodiment. More specifically, in this third embodiment of the present invention, the zigzag part 21 of the bus bar B3 is preferably formed to have a plurality of sections where first and second portions of one edge of the zigzag part 21 face each other. In other words, the zigzag part 21 is preferably arranged such that a first portion of the first edge 21c (or the second edge 21d) is closely adjacent to a second portion of the first edge 21c (or the second edge 21d). In other words, the first and second edges 21c and 21d of the zigzag part 21 of the bus bar B3 are shaped to have a contour with U-turn corners in which the direction of course is substantially reversed such that two portions of the first edge 21c (or the second edge 21d) of the bus bar B3 are closely adjacent to each other and run substantially parallel to each other as seen in FIG. 4.

The bus bar B3 illustrated in FIG. 4 can be made easily by cutting out portions of a piece of sheet metal material. Moreover, due to the sharp turns formed in the zigzag part 21, the bus bar B3 of the fourth embodiment includes a plurality of regions in which a current flow in one portion of the bus bar B3 is substantially opposite from a current flow in another portion of the bus bar B3 that is closely adjacent to said one portion of the bus bar B3. As a result, the magnetic field radiating around the bus bar B3 is weakened and the wiring induction is reduced in comparison with the semiconductor device mounting structure of the first embodiment illustrated in FIG. 1. Although not shown in FIG. 4, it will be apparent to those skilled in the art from this disclosure that a second terminal 23 of the bus bar B3 is configured and arranged to be coupled to the external device D through the threaded hole 5 as shown in FIG. 1.

Figure 5:
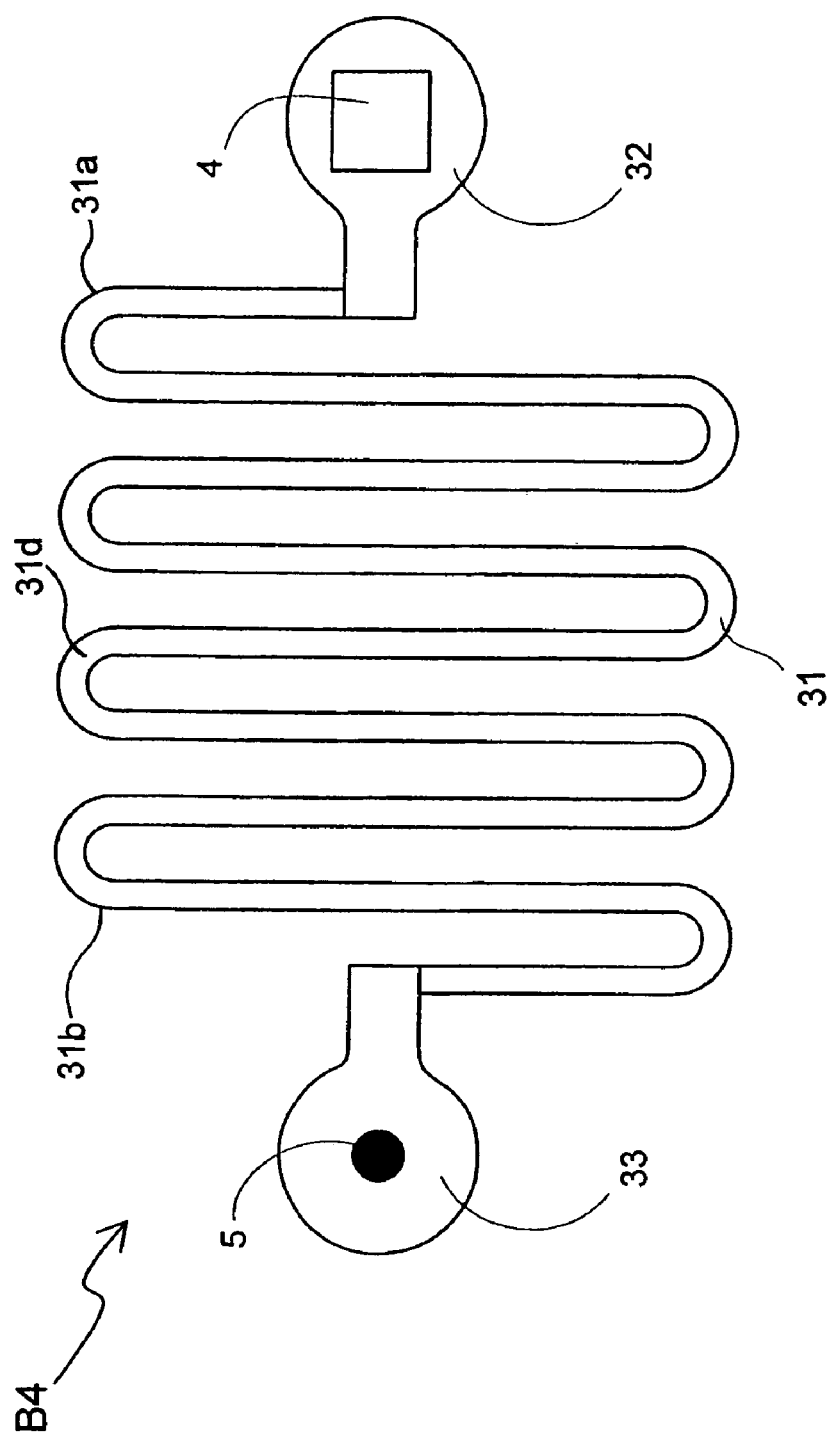
FIG. 5 is a top plan view of a semiconductor device mounting structure in which features of the semiconductor device mounting structure illustrated in FIG. 2 and the semiconductor device mounting structure illustrated in FIG. 4 are combined in accordance with a fourth embodiment of the present invention.

FIG. 5 is a top plan view of a bus bar B4 used in a semiconductor device mounting structure of a fourth embodiment. In the fourth embodiment of the present invention, the features of the bus bar B3 of the third embodiment illustrated in FIG. 4 are applied to the bus bar B2 of the second embodiment shown in FIGS. 2 and 3 to obtain the bus bar B4 as shown in FIG. 5. Similarly to FIG. 3, FIG. 5 illustrates the thickness dimension of a zigzag part 31 of the bus bar B4.

In the fourth embodiment of the present invention, each of first and second main surfaces 31a and 31b in the zigzag part 31 of the bus bar B4 preferably includes a plurality of sections in which the first main surface 31a (or the second main surface 31b) is folded so that a first portion of the first main surface 31a (or the second main surface 31b) is disposed closely adjacent to a second portion of the first main surface 31a (or the second main surface 31b). Moreover, as seen in FIG. 5, the zigzag part 31 is preferably arranged such that the closely adjacent first and second portions of the first main surface 31a (or the second main surface 31b) are substantially parallel to each other. Although not shown in FIG. 5, it will be apparent to those skilled in the art from this disclosure that a second terminal 33 of the bus bar B4 is configured and arranged to be coupled to the external device D through the threaded hole 5 as shown in FIG. 1.

Figure 6:
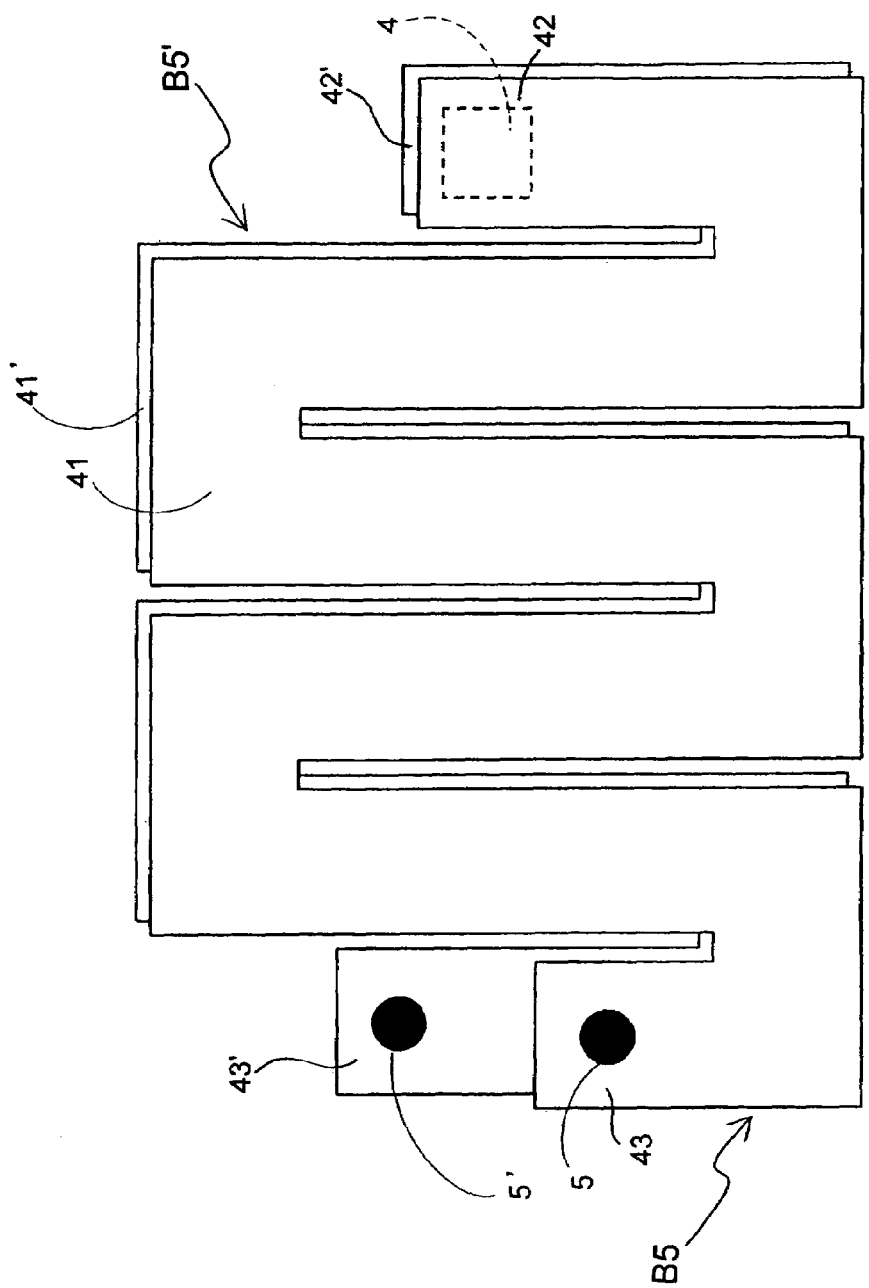
FIG. 6 is a simplified perspective view of a semiconductor device mounting structure in which a pair of bus bars having substantially identically shaped ribbonlike parts are disposed with main surfaces of the bus bars closely adjacent together and facing each other in accordance with a fifth embodiment of the present invention.

FIG. 6 is a simplified perspective view of a bus bar structure used in a semiconductor device mounting structure in accordance with a fifth embodiment of the present invention. The semiconductor device mounting structure of the fifth embodiment utilizes a pair of first and second bus bars B5 and B5' that are substantially similar to the bus bar B3 illustrated in FIG. 4. As seen in FIG. 6, the first and second bus bars B5 and B15' includes a first terminals 42 and 42', respectively, that are connected to first and second main electrodes (not shown) arranged on first and second main surfaces of the semiconductor device 4 that are disposed opposite to each other, respectively. In FIG. 6, the thickness dimensions of the first and second bus bars B5 and B5' are not depicted to simplify the drawing.

As seen in FIG. 6, the first and second bus bars B5 and B5' are preferably disposed substantially parallel to each other such that zigzag parts 41 and 41' of the first and second bus bars B5 and B5', respectively, substantially overlap each other with the surfaces of the zigzag parts 41 and 41' facing each other. With the semiconductor device mounting structure of the fifth embodiment, the mutual effects of the opposing currents in each of the first and second bus bars B5 and B5' and the opposing orientation of the current flowing in one of the first and second bus bars B5 and B5' as opposed to the current flowing in the other one of the first and second bus bars B5 and B5' cause the overall wiring inductance to be even lower. In FIG. 6, the semiconductor device 4 disposed and hidden between the first and second bus bars B5 and B5' is depicted with a broken line. A second terminal 43 of the bus bar B5 is preferably configured and arranged to be coupled to a first main terminal of an external device through the threaded hole 5 and a second terminal 43' of the bus bar B5' is preferably configured and arranged to be coupled to a second main terminal of the external device through the threaded hole 5'.

Figure 7:
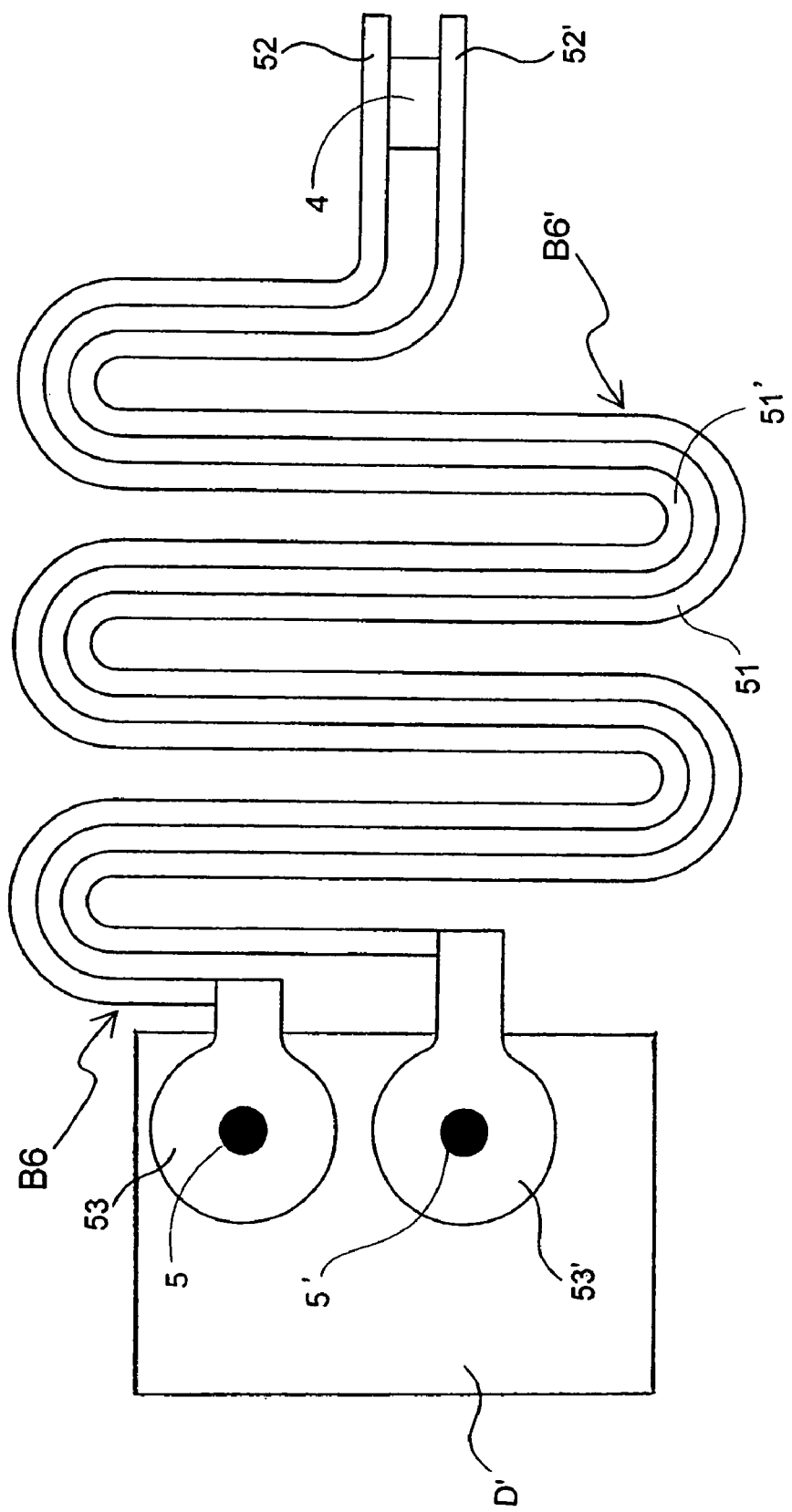
FIG. 7 is a top plan view of a semiconductor device mounting structure in which a pair of bus bars having ribbonlike parts that follow substantially identical zigzag paths are arranged such that main surfaces of the bus bars are facing each other and disposed closely adjacent to each other in accordance with a sixth embodiment of the present invention.

FIG. 7 is a top plan view of a bus bar structure used in a semiconductor device mounting structure in accordance with a sixth embodiment of the present invention. In the sixth embodiment of the present invention, a pair of first and second bus bars B6 and B6' are used that are substantially similar to the bus bar B4 of the fourth embodiment illustrated in FIG. 5. The pair of first and second bus bars B6 and B6' are configured to follow substantially identical zigzag paths and are disposed closely adjacent to each other such that the surfaces of the first bus bar 51 and the second bus bar 51' are disposed substantially parallel to each other as seen in FIG. 7. Moreover, as seen in FIG. 7, a second terminal 53 of the bus bar B6 is preferably configured and arranged to be coupled to a first main terminal of an external device D' through the threaded hole 5 and a second terminal 53' of the bus bar B6 is preferably configured and arranged to be coupled to a second main terminal of the external device D' through the threaded hole 5'. The semiconductor device mounting structure of the sixth embodiment provides substantially same effects as the semiconductor device mounting structure of the fifth embodiment illustrated in FIG. 6. Similar to FIGS. 3 and 5, the thickness dimensions of zigzag parts 51 and 51' of the bus bars B6 and B6' are depicted in FIG. 7.

Figure 8:
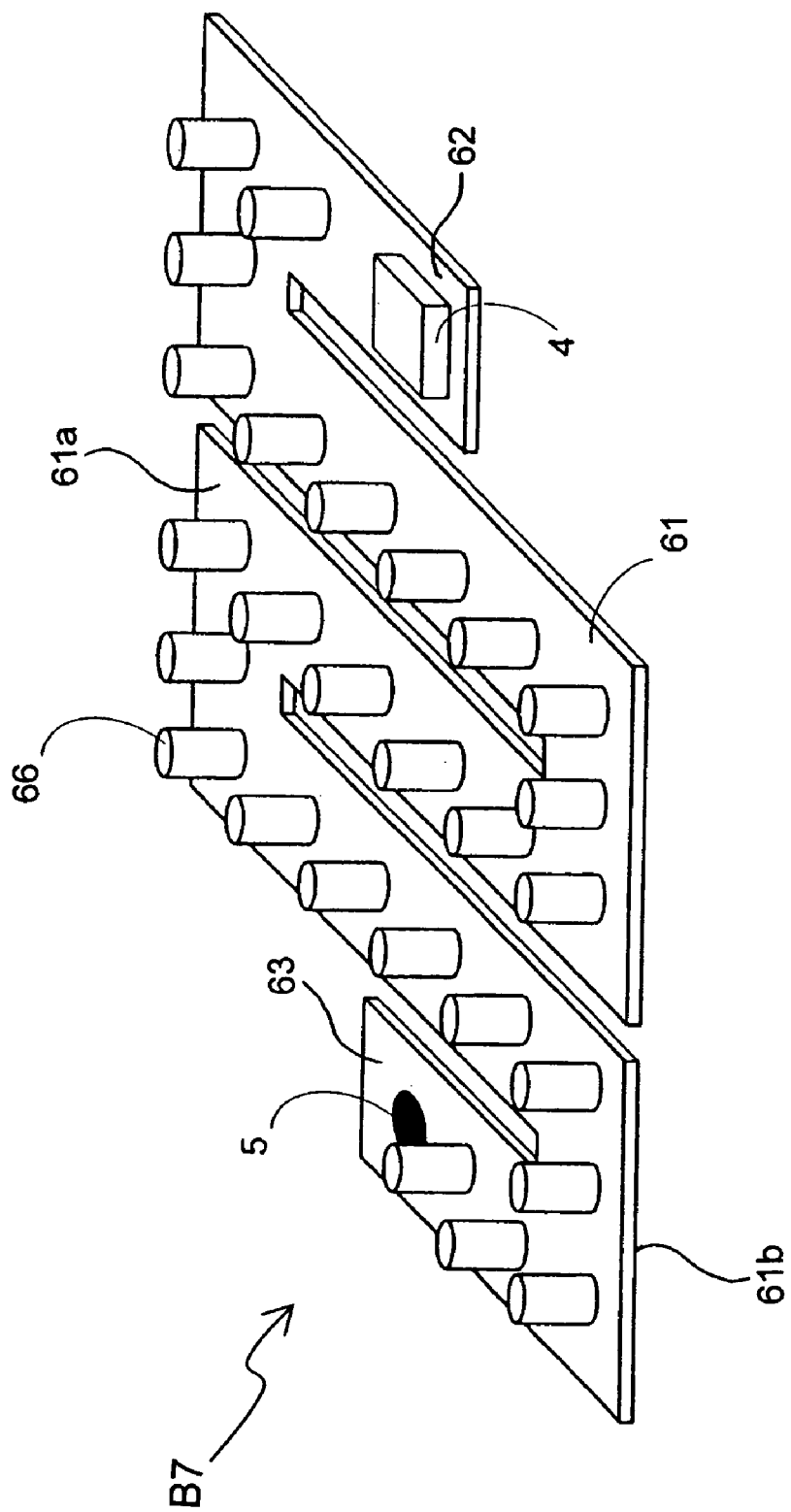
FIG. 8 is a perspective view of a semiconductor device mounting structure with a bus bar having a ribbonlike part including heat radiating protrusions in accordance with a seventh embodiment of the present invention.

FIG. 8 is a perspective view of a semiconductor device mounting structure of a seventh embodiment. In the seventh embodiment of the present invention, the semiconductor device mounting structure utilizes a bus bar B7 that is substantially identical to the bus bar B3 illustrated in FIG. 4 except that a heat radiating mechanism or cooling mechanism is provided on a first main surface 61a of the zigzag part 61 of the bus bar B7 in order to increase the heat radiating efficiency of the bus bar B7. More specifically, a plurality of heat radiating protrusions 66 are preferably provided on the zigzag part 61 of the bus bar B7. Thus, the semiconductor device mounting structure of the seventh embodiment enables the cooling efficiency to be increased by allowing air to blow across the heat radiating protrusions 66. Although not shown in FIG. 8, it will be apparent to those skilled in the art from this disclosure that a second terminal 63 of the bus bar B7 is configured and arranged to be coupled to the external device D through the threaded hole 5 as shown in FIG. 1.

Although the heat radiating protrusions 66 are provided only on the first main surface 61a of the bus bar B7 in FIG. 8, it is also acceptable to provide the heat radiation protrusions 66 on both of the first and second main surfaces 61a and 61b. Moreover, the heat radiation protrusions 66 may be configured as a plurality of slit-shaped fins.

Since there is usually a limit to the heat radiating capacity per unit area regardless of a precise structure of the heat radiating mechanism used, when a bus bar does not include a zigzag part, the heat radiating capacity cannot be increased over a certain level even if the heat radiating mechanism is provided on the bus bar. However, with the semiconductor device mounting structure of the seventh embodiment of the present invention, this limit in the heat radiating capacity of the bus bar B7 can be overcome with respect to the entire semiconductor device mounting structure by providing the bus bar B7 with the zigzag part 61 and providing the heat radiating mechanism on the zigzag part 61 of the bus bar B7.

Figure 9:
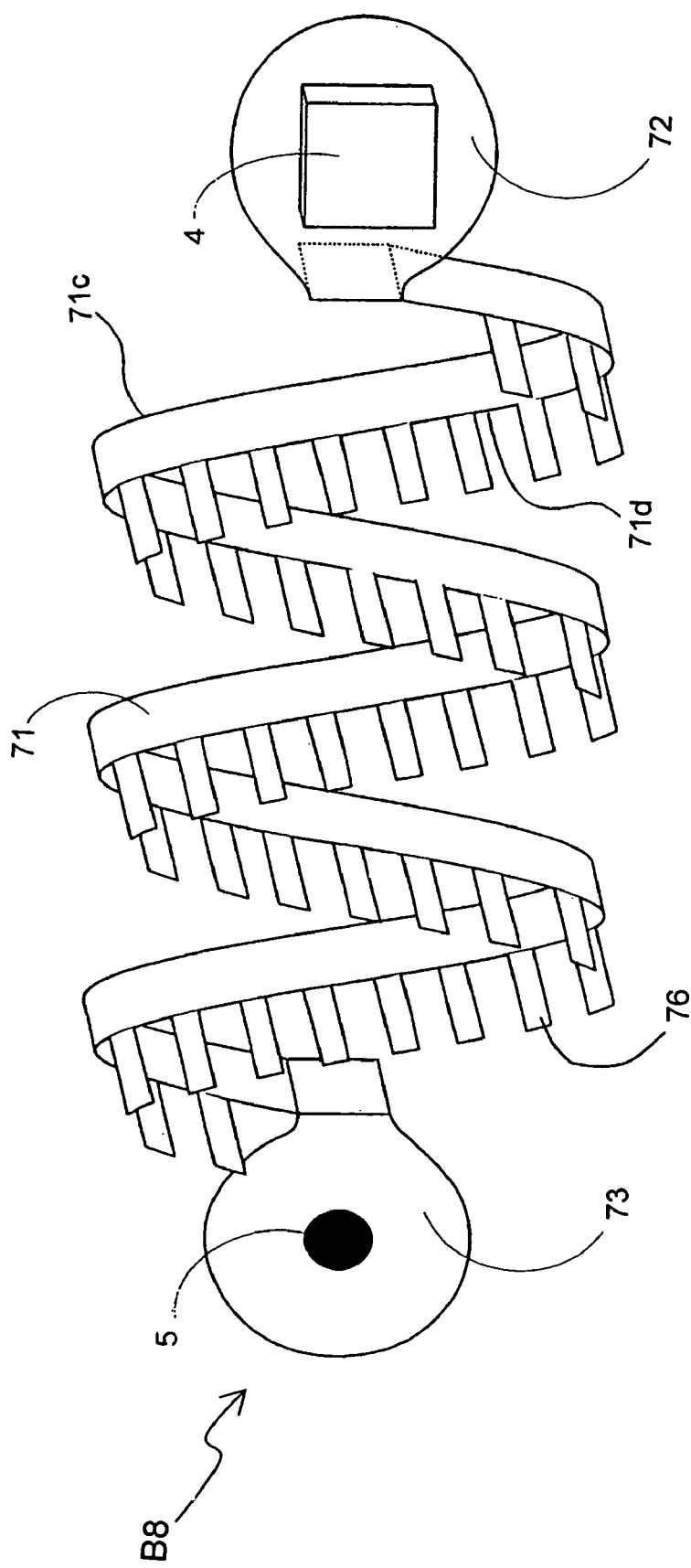
FIG. 9 is a simplified perspective view of a semiconductor device mounting structure with a bus bar having a ribbonlike part including outwardly projecting heat radiating fins on one side thereof in accordance with an eighth embodiment of the present invention.

FIG. 9 is a simplified perspective view of a semiconductor device mounting structure of an eighth embodiment. The semiconductor device mounting structure of the eight embodiment utilizes a bus bar B8 that is substantially identical to the bus bar B2 of the second embodiment illustrated in FIG. 2 except that the bus bar B8 is provided with a plurality of outwardly extending heat radiating fins 76 on a second edge 71d of a zigzag part 71 of the bus bar B8. As in FIG. 2, the thickness dimensions of the bus bar B8 and the heat radiating fins 76 are not depicted in FIG. 9. Moreover, although not shown in FIG. 9, it will be apparent to those skilled in the art from this disclosure that a second terminal 73 of the bus bar B8 is configured and arranged to be coupled to the external device D through the threaded hole 5 as shown in FIG. 9.

Figure 10:
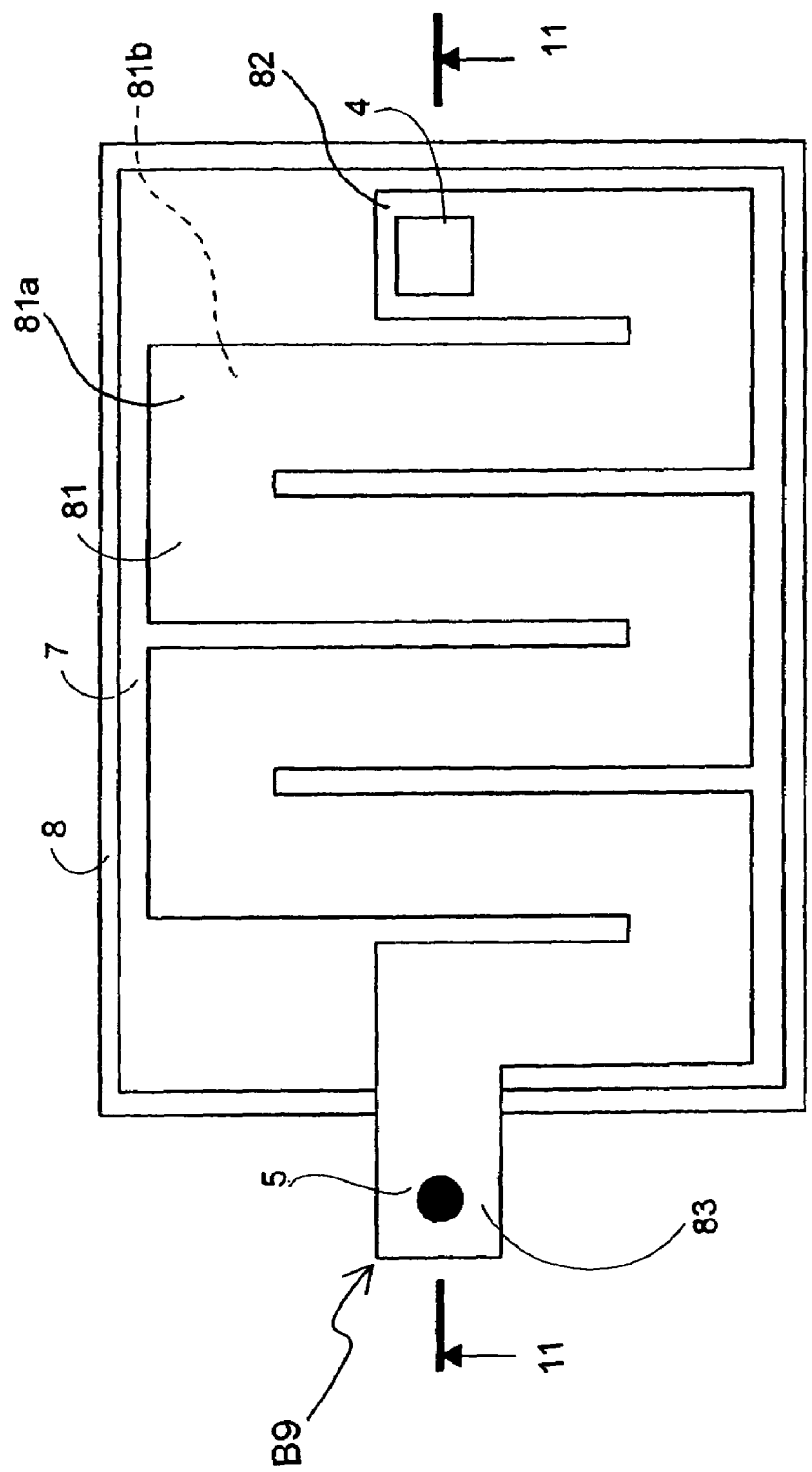
FIG. 10 is a top plan view of a semiconductor device mounting structure with a plurality of heat radiating fins that are electrically insulated from a bus bar in accordance with a ninth embodiment of the present invention.
Figure 11:
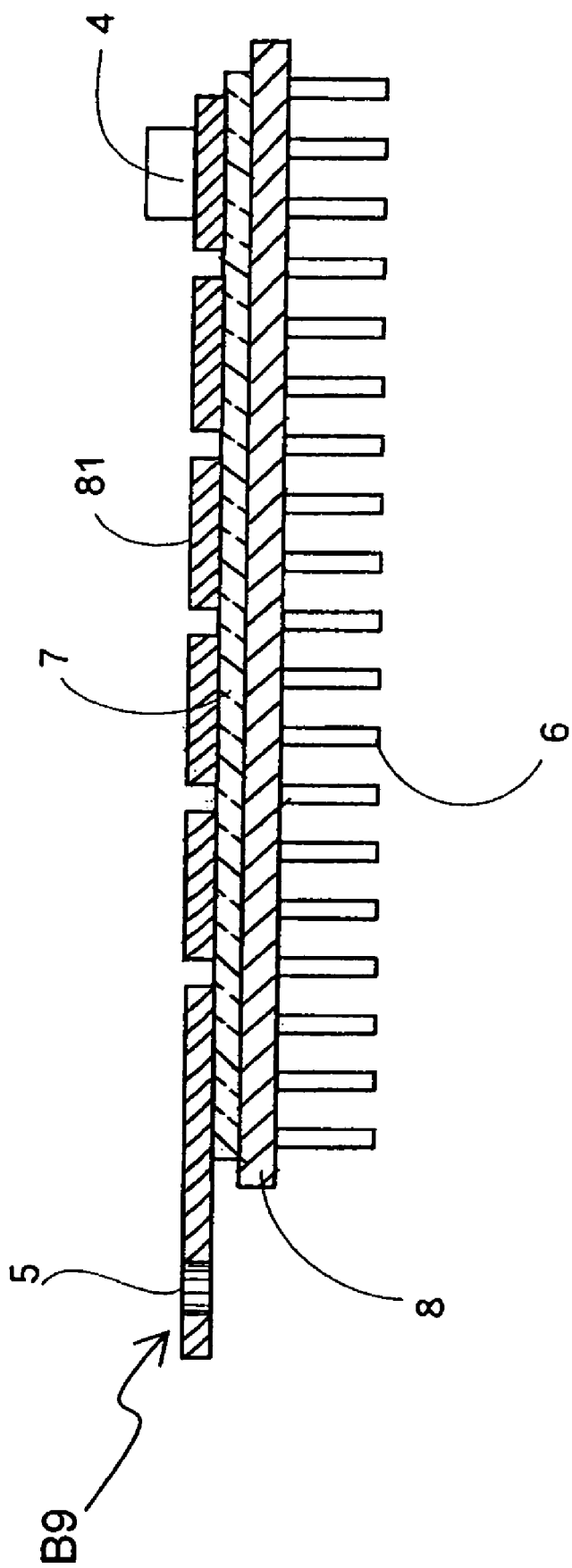
FIG. 11 is a partial cross sectional view of the semiconductor device mounting structure in accordance with the ninth embodiment of the present invention taken along a section line 11—11 of FIG. 10.

FIGS. 10 and 11 illustrate a semiconductor device mounting structure of a ninth embodiment. The semiconductor device mounting structure of the ninth embodiment is substantially identical to the semiconductor device mounting structure of the third embodiment illustrated in FIG. 4 except the semiconductor device mounting structure of the ninth embodiment includes a heat radiating mechanism that are electrically insulated from a bus bar B9. The bus bar B9 is substantially identical to the bus bar B3 of the third embodiment except for the orientation of a second terminal 83. FIG. 10 is a top plan view of the semiconductor device mounting structure of the ninth embodiment and FIG. 11 is a partial cross sectional view of the semiconductor device mounting structure illustrated in FIG. 10 taken along a section line 11—11 of FIG. 10 in a plane perpendicular to the plane of the paper. In FIG. 11, the bus bar B9, the electrically insulating material 7 and the cooling substrate 8 are shown in cross section.

As shown in FIGS. 10 and 11, the bus bar B9 includes a zigzag part 81 that zigzags in a plane parallel to the first and second main surfaces 81a and 81b of the bus bar B9. Moreover, in the ninth embodiment of the present invention, the bus bar B9 is preferably connected to a metal heat radiating substrate 8 through an electrically insulating material 7 as seen in FIGS. 10 and 11. As seen in FIG. 11, the heat radiating substrate 8 is preferably provided with a plurality of heat radiating fins 6 to form a metal heat radiating mechanism or metal cooling mechanism. Although the heat radiating performance of the heat radiating fins 6 is somewhat diminished by the electrically insulating material 7, the semiconductor device mounting structure of the ninth embodiment allows high voltage to be applied to the bus bar B9 because the heat radiating mechanism is electrically insulated.

Figure 12:
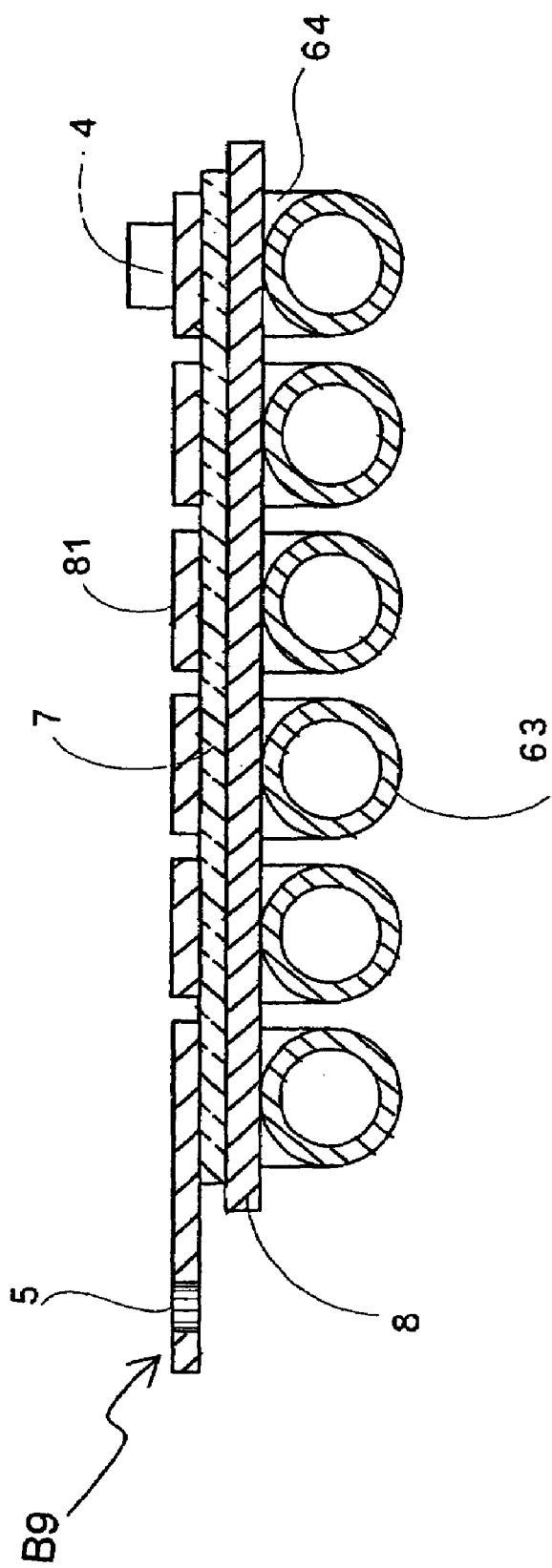
FIG. 12 is a partial cross sectional view of a modified semiconductor device mounting structure with a heat pipe or water tube used to cool a bus bar in accordance with the ninth embodiment of the present invention.

Alternatively, the heat radiating mechanism can be constituted with a heat pipe or a water tube 63 as shown in a partial cross sectional view of FIG. 12 instead of the heat radiating fins 6. In FIG. 12, the bus bar B9, the electrically insulating material 7 and the cooling mechanism are shown in cross section. In such case, the heat pipe or a water tube 63 is preferably configured and arranged to form a zigzag shape that follows the contour of the bus bar B9 when viewed from top. FIG. 12 illustrates a cross sectional view of the water tube 63 attached to the heat radiating substrate 8 with a weld 64. Although the water tube 63 is illustrated as being made of metal, it will be apparent to those skilled in the art from this disclosure that the water tube 63 is not limited to metal, and any material that is suitable to form the water tube 63 can be utilized in accordance with the present invention. In the semiconductor device mounting structures shown in FIGS. 10 to 12, the electrically insulating material 7 is preferably made of a material that has good heat conductive properties in addition to being an electrical insulator (e.g., ceramic material).

When the heat radiating substrate 8 is provided over an entire region of the bus bar B9 as shown in FIGS. 10 to 12, the bus bar B9 can share the heat radiating mechanism and heat radiating substrate 8 with another bus bar and, in some cases, the heat radiating substrate 8 can be utilized as part of a casing or enclosure. In short, the design freedom is increased. Also, since the electromagnetic field radiating from the zigzag part 81 of the bus bar B9 is weakened by the current induced in the heat radiating mechanism made of metal, the wiring inductance is reduced even further. In other words, the existence of the integral metal heat radiating mechanism enables a mirror image effect to be obtained with respect to the current flowing through the zigzag part 81 of the bus bar B9, thereby lowering the inductance.

Figure 13:
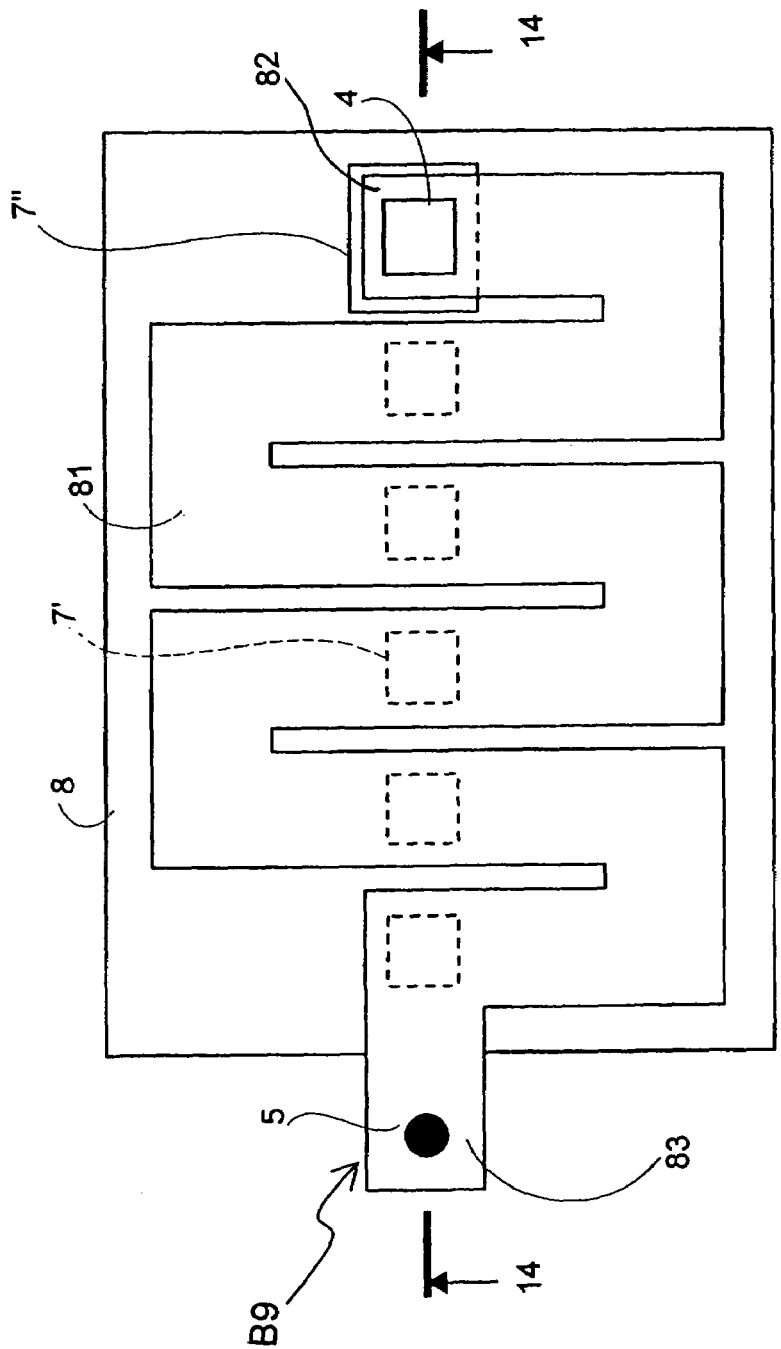
FIG. 13 is a top plan view of a semiconductor device mounting structure with an electrically insulating material mounted to a selected portions of a bus bar in accordance with a tenth embodiment of the present invention.
Figure 14:
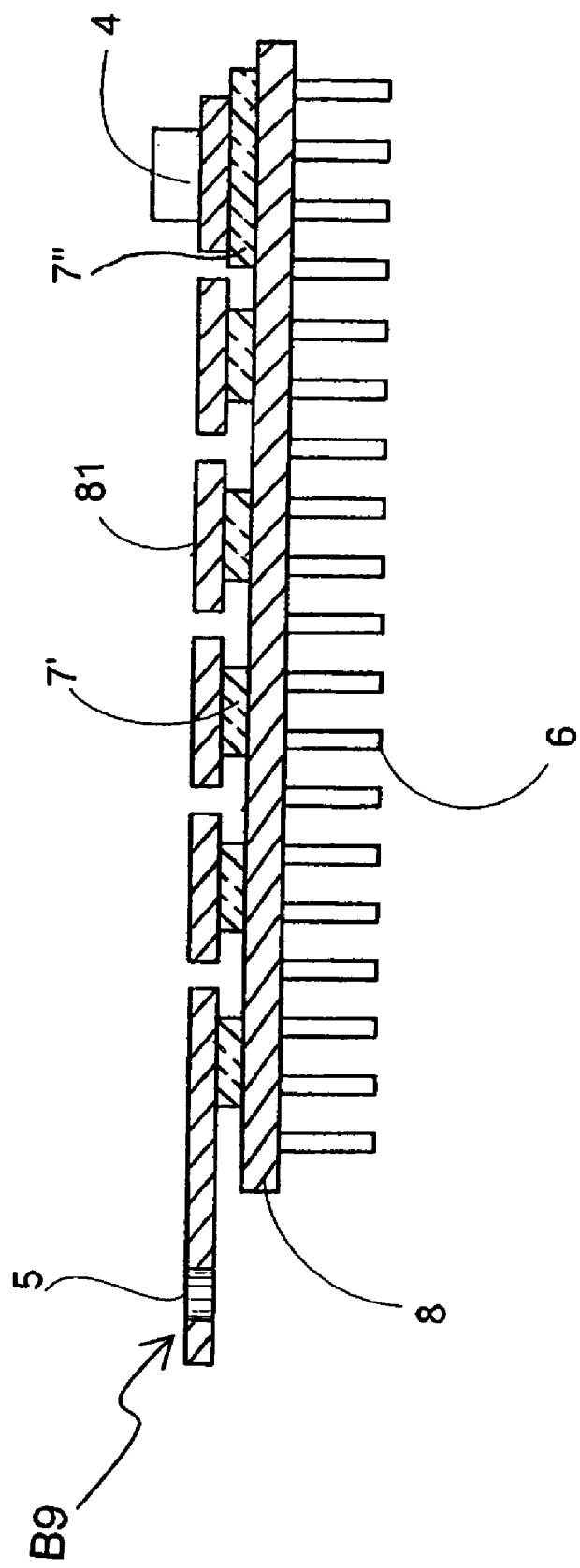
FIG. 14 is a partial cross sectional view of the semiconductor device mounting structure illustrated in FIG. 13 in accordance with the tenth embodiment of the present invention taken along a section line 14—14 of FIG. 13.

FIGS. 13 and 14 illustrate a semiconductor device mounting structure of a tenth embodiment. The semiconductor device mounting structure of the tenth embodiment of the present invention is basically identical to the semiconductor device mounting structure of the ninth embodiment shown in FIGS. 10 and 11 except that a plurality of electrically insulating materials 7' and 7" (metal contact plates) that couple the heat radiating substrate 8 with the bus bar B1 are provided in selected portions between the heat radiating substrate 8 and the bus bar B9 instead of the single electrically insulating material 7. FIG. 13 is a top plan view of the semiconductor device mounting structure of the tenth embodiment of the present invention. The selected portions in which the electrically insulating materials 7' are disposed are indicated with broken lines in FIG. 13. As seen in FIG. 13, the electrically insulating materials 7' are not arranged on the entire bus bar B9. Moreover, the insulating material 7" used in a portion directly under the semiconductor device 4 is preferably arranged larger than the insulating material 7' used in other portions as seen in FIG. 13. FIG. 14 is a partial cross sectional view of the semiconductor device mounting structure of the tenth embodiment taken along a section line 14—14 of FIG. 13. In FIG. 14, the bus bar B9, the electrically insulating materials 7' and 7", and the cooling substrate 8 are shown in cross section. Although not shown in FIGS. 13 and 14, it will be apparent to those skilled in the art from this disclosure that the second terminal 83 of the bus bar B9 is configured and arranged to be coupled to the external device D through the threaded hole 5 as shown in FIG. 1.

When, as shown in FIG. 12, the electrically insulating material 7 is thermally coupled over an entire surface of the bus bar B9 and also over an entire surface of the heat radiating mechanism (e.g., the cooling substrate 8), heat may be easily transmitted to adjacent segments of the zigzag part 81 of the bus bar B9 through the heat radiating mechanism and the effect of the zigzag part 81 may be reduced. Thus, in the tenth embodiment of the present invention, the heat transfer path from the bus bar B9 to the cooling substrate 8 is reduced by reducing the size of the electrically insulating material 7 to a smaller size as the electrically insulating materials 7' and 7" as shown in FIG. 13. Therefore, the heat conduction from the bus bar B9 to the heat radiating mechanism (e.g., a cooling device including the cooling substrate 8 and the heat radiating fins 6 or the water tube 63) is degraded but the efficiency of the semiconductor device mounting structure is improved from the perspective of preventing the transfer of heat from the semiconductor device 4 to the second terminal 83 of the bus bar B9.

Furthermore, in the case of air cooling, the heat transfer rate from the heat radiating mechanism to the air is an order of magnitude larger than the thermal resistance of the solid material existing between the heat emitting part (e.g., the semiconductor device 4) and the boundary surface between the heat radiating mechanism and the air. Consequently, even if the thermal resistance of the solid material is increased several-fold, the resulting effect on the overall cooling efficiency of the semiconductor device mounting structure will not be terribly large.

Additionally, in the semiconductor device mounting structure of the tenth embodiment shown in FIGS. 13 and 14, the electrically insulating materials 7' and 7" are preferably attached to the bus bar B9 along a centerline that divides the bus bar B9 in half in a direction perpendicular to the amplitude dimension of the zigzag part 81 of the bus bar B9 (i.e. on the section line 14—14 in FIG. 13). This arrangement of the electrically insulating materials 7' and 7" enable the differences in the coefficients of thermal expansion of the material used for the bus bar B9 and the material used for the heat radiating mechanism to be alleviated with little effort. The arrangement of the electrically insulating materials 7' and 7" in the semiconductor device mounting structure is also optimum from the perspective of vibration of the bus bar B9 and the center of gravity of the bus bar B9.

Moreover, if there is little concern regarding the difference between the coefficients of thermal expansion of the heat radiating substrate 8 and the electrically insulating material 7, it is also feasible to use an electrically insulating material 7 having a large surface area as shown in FIG. 10, and fixedly coupling the electrically insulating material 7 to the heat radiating substrate 8 only at the selected regions indicated with broken lines in FIG. 13.

Moreover, the semiconductor device mounting structures shown in FIGS. 9 to 13 can be combined with a dual bus bar arrangement shown in FIG. 6. In such case, the cooling mechanism is preferably provided on each free side of the first and second bus bars B5 and B5' with the electrically insulating material (e.g., the electrically insulating material 7 or electrically insulating materials 7' and 7") disposed there between. Thus, the first and second bus bars B5 and B5' connected to the first and second main electrodes of the semiconductor device 4 are preferably cooled by the cooling mechanisms disposed on both free sides of the first and second bus bars B5 and B5' to promote cooling.

Figure 15:
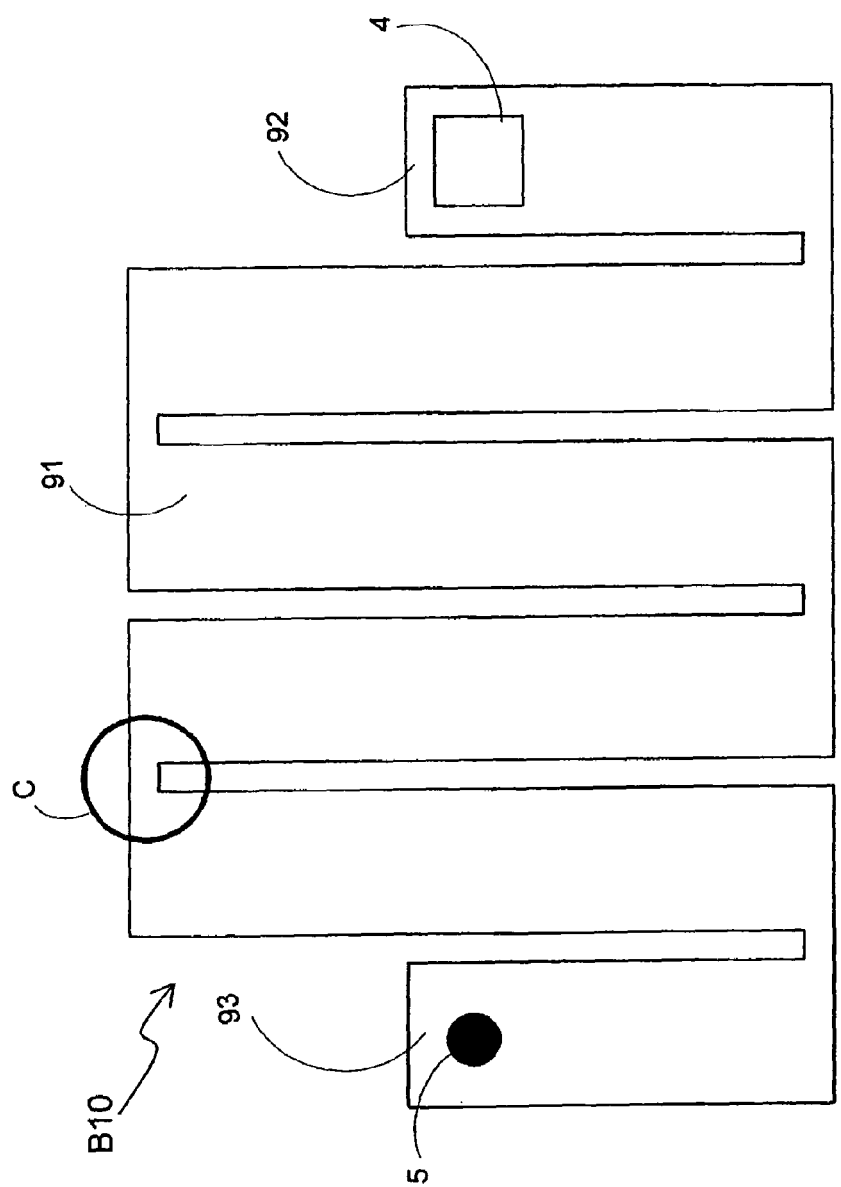
FIG. 15 is a top plan view of a bus bar used in a semiconductor device mounting structure in which the semiconductor device mounting structure illustrated in FIG. 13 is modified in accordance with an eleventh embodiment of the present invention.

FIG. 15 is a top plan view of a bus bar B10 used in a semiconductor device mounting structure of an eleventh embodiment. The bus bar B10 of the eleventh embodiment is basically identical to the bus bar B9 of the tenth embodiment shown in FIG. 13 except that a width of the bus bar B10 is narrowed in a localized manner at portions corresponding to the maximum amplitude of a zigzag part 91 of the bus bar B10 as seen in FIG. 15. One of the locations where the width of the bus bar B10 is narrowed is indicated with a circle C in FIG. 15. These narrow width portions of the bus bar B10 serve to alleviate the stresses acting or developed in the bus bar B10. Although not shown in FIG. 15, it will be apparent to those skilled in the art from this disclosure that a second terminal 93 of the bus bar B10 is configured and arranged to be coupled to the external device D through the threaded hole 5 as shown in FIG. 1.

Figure 16:
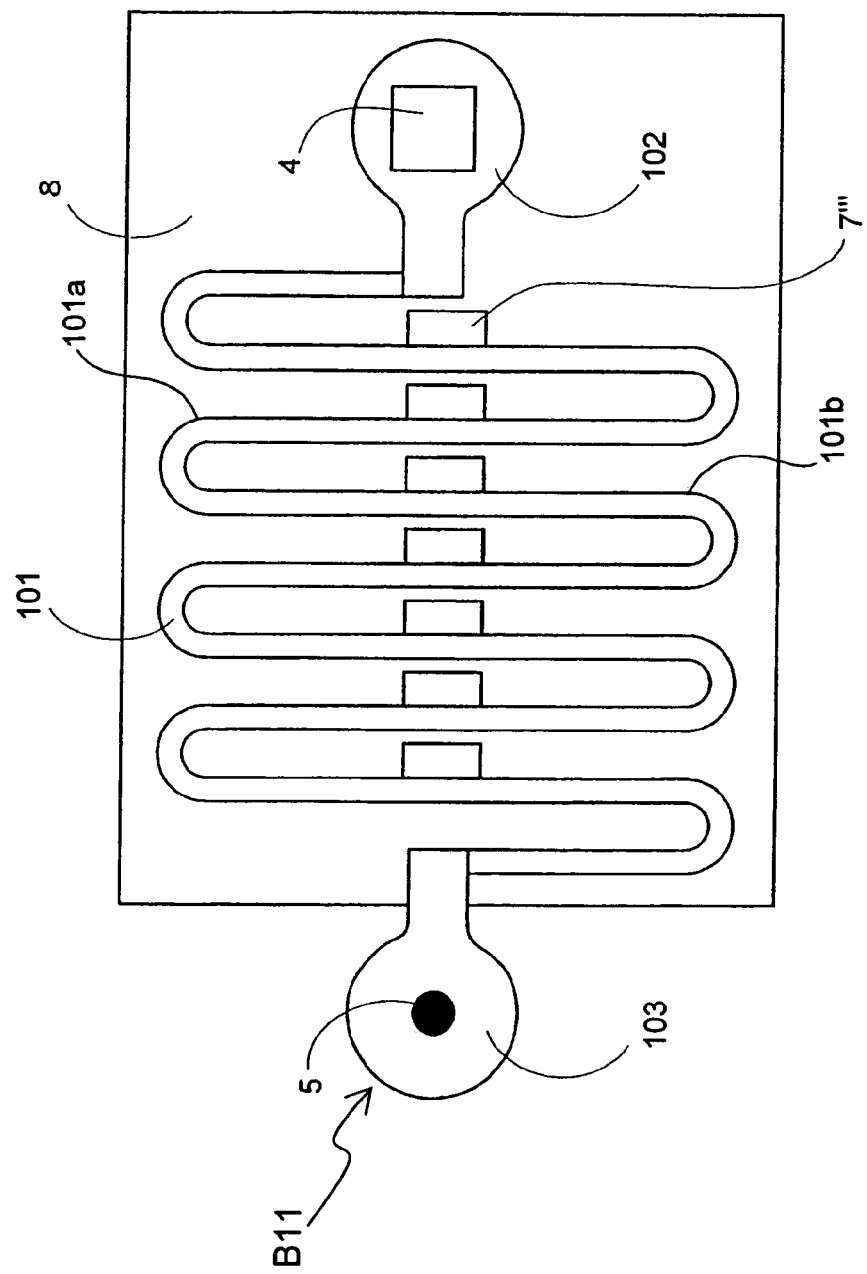
FIG. 16 is a top plan view of a semiconductor device mounting structure in which the semiconductor device mounting structure illustrated in FIG. 13 is modified in accordance with a twelfth embodiment of the present invention.

FIG. 16 illustrates a semiconductor device mounting structure in accordance with a twelfth embodiment which is substantially similar to the fourth embodiment shown in FIG. 5 except for the semiconductor device mounting structure of the twelfth embodiment incorporates a similar arrangement of the electrically insulating materials 7' and the heat radiating mechanism (i.e., the cooling substrate 8 and the heat radiating fins 6) of the tenth embodiment shown in FIGS. 13 and 14. More specifically, one lateral surface of each of a plurality of rectangular parallelepiped shaped electrically insulating materials 7''' is preferably alternatively attached to a first main surface 101a and a second main surface 101b of a bus bar B11 of the twelfth embodiment. Each of the rectangular parallelepiped shaped electrically insulating materials 7''' is configured and arranged to extend beyond the bus bar B11 toward the heat radiating substrate 8 (e.g., extend in a direction further into the paper in FIG. 16) so that an adjoining bottom surface of each of the rectangular parallelepiped shaped electrically insulating materials 7''' is connected to the heat radiating substrate 8. In other words, the side surface of each of the rectangular parallelepiped shaped electrically insulating materials 7''' is attached to the bus bar B11 and the bottom surface of each of the electrically insulating materials 7''' is attached to the heat radiating substrate 8. With the semiconductor device mounting structure of the twelfth embodiment as shown in FIG. 16, the wiring inductance and thermal stresses are suppressed and heat from the first terminal 2 of the bus bar B11 is prevented from reaching the second electrode 3 with a compact arrangement. Although not shown in FIG. 16, it will be apparent to those skilled in the art from this disclosure that a second terminal 103 of the bus bar B11 is configured and arranged to be coupled to the external device D through the threaded hole 5 as shown in FIG. 1.

As used herein, the following directional terms "forward, rearward, above, downward, vertical, horizontal, below and transverse" as well as any other similar directional terms refer to those directions of a semiconductor device mounting structure of the present invention. Accordingly, these terms, as utilized to describe the present invention should be interpreted relative to the semiconductor device mounting structure of the present invention.

The terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2003-404188. The entire disclosure of Japanese Patent Application No. 2003-404188 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A semiconductor device mounting structure comprising:
   a first end part configured and arranged to be connected to a first main terminal of a heat-emitting semiconductor device;
   a second end part configured and arranged to be connected to a first main terminal of an electrical device that requires to be kept at a lower temperature than the semiconductor device; and
   a ribbonlike part having a generally flat shape zigzagging between the first and second end parts, the ribbonlike part being electrically conductive to transmit electricity between the first main terminal of the heat-emitting semiconductor device and the first main terminal of the electrical device.

2. The semiconductor device mounting structure recited in claim 1, wherein
   the ribbonlike part includes a first main surface and a second main surface disposed on an opposite side of the first main surface such that the ribbonlike part zigzags in a plane substantially parallel to the first and second main surfaces.

3. The semiconductor device mounting structure recited in claim 1, wherein
   the ribbonlike part is folded back and forth such that edges of the ribbonlike part are aligned.

4. The semiconductor device mounting structure recited in claim 1, wherein
   the ribbonlike part includes at least a section where a first and a second portions of the ribbonlike part are closely adjacent to and run substantially parallel to each other.

5. The semiconductor device mounting structure recited in claim 1, wherein
   the ribbonlike part is provided with a heat radiating mechanism.

6. The semiconductor device mounting structure recited in claim 5, wherein
   the heat radiating mechanism includes a plurality of cooling fins.

7. The semiconductor device mounting structure recited in claim 1, further comprising
   a metal cooling mechanism indirectly coupled to a main surface of the ribbonlike part via an electrically insulating sheet.

8. The semiconductor device mounting structure recited in claim 7, wherein
   the metal cooling system is coupled to the main surface of the ribbonlike part in selected portions of the ribbonlike part along a centerline of the zigzagging.

9. The semiconductor device mounting structure recited in claim 8, wherein
   the metal cooling mechanism includes a cooling device and a plurality of metal contact plates between the cooling device and the selected portion of the ribbonlike portion.

10. The semiconductor device mounting structure recited in claim 8, wherein
    the ribbonlike part has at least one region where a width of the ribbonlike part is narrower than a width in other region of the ribbonlike part.

11. A semiconductor device mounting structure comprising:
    a first bus bar having a first end part configured and arranged to be connected to a first main terminal of a heat-emitting semiconductor device, a second end part configured and arranged to be connected to a first main terminal of an electrical device that requires to be kept at a lower temperature than the semiconductor device, and a ribbonlike part having a generally flat shape zigzagging between the first and second end parts, the ribbonlike part being electrically conductive to transmit electricity between the first main terminal of the heat-emitting semiconductor device and the first main terminal of the electrical device; and a second bus bar having a first end part configured and arranged to be connected to a second main terminal of the semiconductor device, a second end part configured and arranged to be connected to a second main terminal of the electrical device, and a ribbonlike part having a generally flat shape zigzagging between the first and second end parts the ribbonlike part being electrically conductive to transmit electricity between the first main terminal of the heat-emitting semiconductor device and the first main terminal of the electrical device, the first and second bus bars are disposed so that all portions of main surfaces of the ribbonlike parts of the first and second bus bars are closely adjacent and extend generally parallel to each other.

12. The semiconductor device mounting structure recited in claim 11, wherein
the ribbonlike parts of the first and second bus bars are arranged to zigzag in planes substantially parallel to the main surfaces of the first and second bus bars.

13. The semiconductor device mounting structure recited in claim 11, wherein
each of the ribbonlike parts of the first and second bus bars is folded back and forth such that edges of the ribbonlike parts are aligned.

14. The semiconductor device mounting structure recited in claim 11, wherein
the ribbonlike part of the first bus bar includes at least a section where a first and a second portions of the ribbonlike part are closely adjacent to and run substantially parallel to each other, and
the ribbonlike part of the second bus bar includes at least a section where a first and a second portions of the ribbonlike part are closely adjacent to and run substantially parallel to each other.

15. The semiconductor device mounting structure comprising:
semiconductor connecting means for connecting to a first main terminal of a heat-emitting semiconductor device;
electrical device connecting means for connecting to a first main terminal of an electrical device that requires to be kept at a lower temperature than the semiconductor device; and
electrical signal transmitting means for transmitting electrical signals between the semiconductor connecting means and the electrical device connecting means while extending in a zigzagging pattern with a generally flat ribbonlike shape for a distance over which heat transmitted to the semiconductor connecting means from the heat-emitting semiconductor device is radiated from the electrical signal transmitting means.

* * * * *